(12) United States Patent
van Dommelen et al.

(10) Patent No.: US 10,593,567 B2
(45) Date of Patent: Mar. 17, 2020

(54) INTEGRATED CIRCUIT PACKAGE AND METHOD OF MANUFACTURING THE SAME

(71) Applicant: Sencio B.V., Nijmegen (NL)

(72) Inventors: Ignatius Josephus van Dommelen, Vorstenbosch (NL); Johannes Stephanus Jansen, Wijchen (NL)

(73) Assignee: Sencio B.V., Nijmegen (NL)

( * ) Notice: Subject to any disclaimer, the term of this patent is extended or adjusted under 35 U.S.C. 154(b) by 0 days.

(21) Appl. No.: 16/301,448

(22) PCT Filed: May 18, 2017

(86) PCT No.: PCT/NL2017/050315
§ 371 (c)(1),
(2) Date: Nov. 14, 2018

(87) PCT Pub. No.: WO2017/200384
PCT Pub. Date: Nov. 23, 2017

(65) Prior Publication Data
US 2019/0295860 A1    Sep. 26, 2019

(30) Foreign Application Priority Data

May 19, 2016 (EP) .................................. 16170345

(51) Int. Cl.
*H01L 21/56* (2006.01)
*H01L 23/31* (2006.01)
(Continued)

(52) U.S. Cl.
CPC ............ *H01L 21/565* (2013.01); *B29C 45/14* (2013.01); *B29C 45/14639* (2013.01);
(Continued)

(58) Field of Classification Search
None
See application file for complete search history.

(56) References Cited

U.S. PATENT DOCUMENTS

| | | | | |
|---|---|---|---|---|
| 5,886,398 A | * | 3/1999 | Low ...................... | H01L 21/565 257/667 |
| 6,420,201 B1 | * | 7/2002 | Webster ................ | G01L 9/0054 257/E21.504 |

(Continued)

FOREIGN PATENT DOCUMENTS

WO    03/028086 A1    4/2003

OTHER PUBLICATIONS

Cotofana C et al: "Low-cost plastic sensor packaging using the open-window package concept", Sensors and Actuators A: Physical, Elsevier BV, NL, vol. 67, No. 1-3, May 15, 1998 (May 15, 1998), pp. 185-190, XP022713628.

*Primary Examiner* — J. E. Schoenholtz
(74) *Attorney, Agent, or Firm* — N.V. Nederlandsch Octrooibureau; Catherine A. Schultz; Tamara C. Stegmann

(57) ABSTRACT

Method of making an integrated circuit package, by a) providing a plurality of die members (4a, 4b) connected to respective electrical contact members (8a, 8b) in a mould; b) providing a mould insert in contact with at least a part of a first upper surface (6a) of a first die member (4a); c) encasing the plurality of die members (4a, 4b) and the respective electrical contact members (8a, 8b) into a package collection body (3); and d) cutting the package collection body (3) into at least two separate integrated circuit packages (3a, 3b) along a first cutting line ($S_1$) extending through the package collection body (3) and separating the plurality of die members (4a, 4b). The mould insert as provided in step b) extends across a part of the first cutting line ($S_1$).

12 Claims, 2 Drawing Sheets

Figure 1:
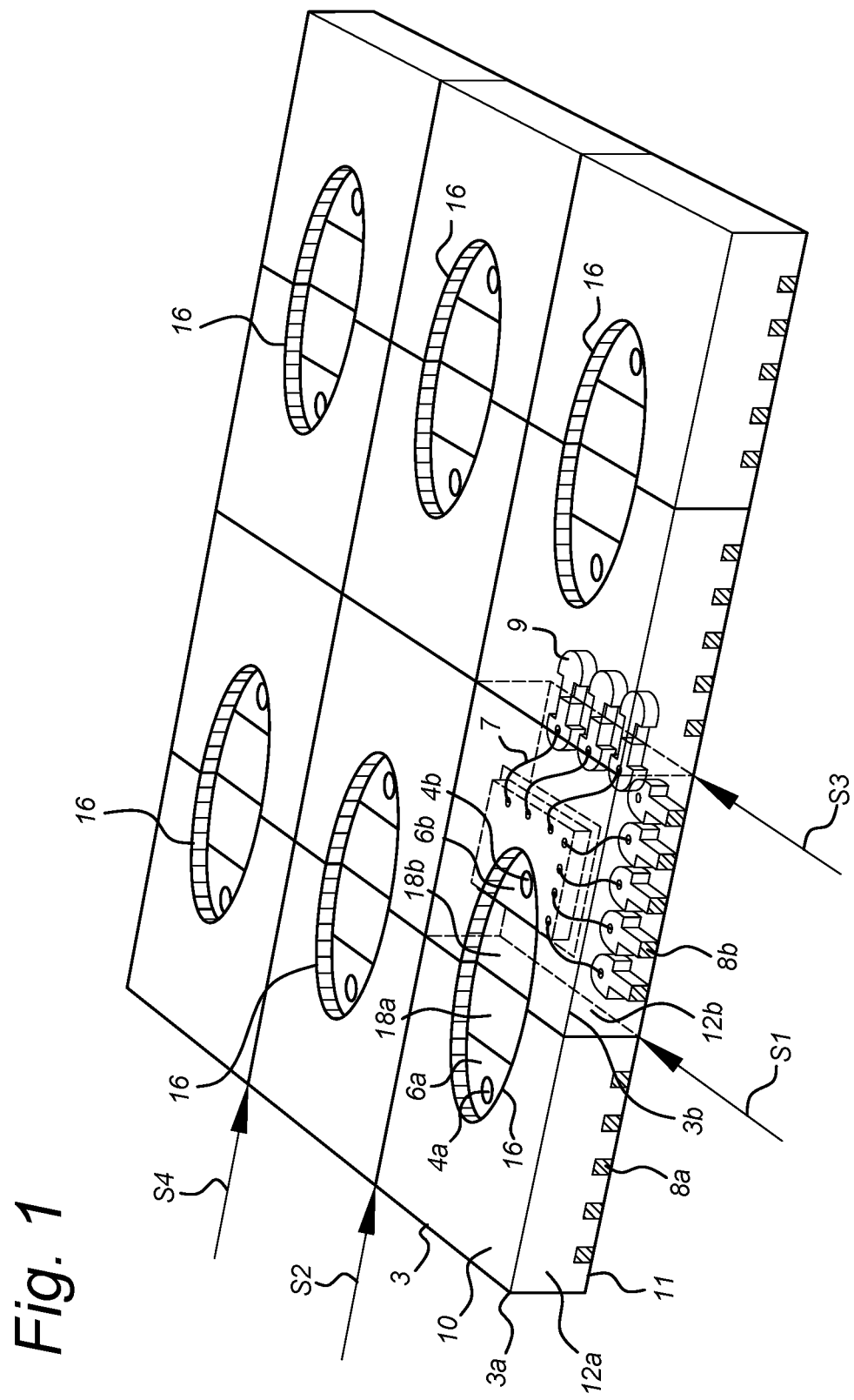

(51) Int. Cl.
  *H01L 23/495* (2006.01)
  *H01L 23/00* (2006.01)
  *B29C 45/14* (2006.01)

(52) U.S. Cl.
  CPC ............ *H01L 21/561* (2013.01); *H01L 23/31* (2013.01); *H01L 23/3157* (2013.01); *H01L 23/4951* (2013.01); *H01L 23/4952* (2013.01); *H01L 23/49531* (2013.01); *H01L 23/49541* (2013.01); *H01L 24/00* (2013.01); *H01L 24/48* (2013.01); *H01L 23/3107* (2013.01); *H01L 2224/45099* (2013.01); *H01L 2224/48091* (2013.01); *H01L 2224/48105* (2013.01); *H01L 2224/48106* (2013.01); *H01L 2224/48177* (2013.01); *H01L 2224/48247* (2013.01); *H01L 2224/49175* (2013.01); *H01L 2224/97* (2013.01)

(56) References Cited

U.S. PATENT DOCUMENTS

| | | |
|---|---|---|
| 2004/0159961 A1 | 8/2004 | Mensch et al. |
| 2009/0079091 A1 | 3/2009 | Song et al. |
| 2015/0000395 A1 | 1/2015 | Tashiro et al. |
| 2015/0059454 A1* | 3/2015 | Vaupel ................ H01L 23/3185 73/65.09 |
| 2015/0243588 A1* | 8/2015 | Edwards ........... H01L 23/49503 257/670 |
| 2015/0270206 A1* | 9/2015 | Lo ......................... H01L 23/481 257/417 |
| 2015/0344294 A1* | 12/2015 | Ghahremani ........... B81B 7/007 257/419 |
| 2016/0068387 A1* | 3/2016 | Nakanishi ............. B81C 1/0023 257/415 |
| 2017/0010135 A1* | 1/2017 | Hansen ................. B81B 7/0058 |
| 2017/0197823 A1* | 7/2017 | Wachtler ............. H01L 23/3135 |
| 2017/0278825 A1* | 9/2017 | Lakhera ............ H01L 23/49575 |
| 2017/0292884 A1* | 10/2017 | Ching, Jr. ............. G01L 9/0042 |
| 2018/0273376 A1* | 9/2018 | Feyh ....................... H01L 23/28 |

* cited by examiner

INTEGRATED CIRCUIT PACKAGE AND METHOD OF MANUFACTURING THE SAME

FIELD OF THE INVENTION

The present invention relates to a method of manufacturing an integrated circuit package, in particular to a method of manufacturing a Quad Flat No-lead (QFN) integrated circuit package, a Land Grid Array (LGA) integrated circuit package or a Ball Grid Array (BGA) integrated circuit package. In a further aspect the present invention relates to an integrated circuit package.

PRIOR ART

International application WO 03/028086 discloses a method for encapsulating a chip with encapsulant, wherein one portion of a surface of the chip must remain free of encapsulant. The method comprises the steps of fixing the chip on a lead frame, substrate, film or other carrier that can be provided with a suitable conductor structure and placing the carrier and chip in one part of a two-part or multi-part mould. A further step of the method then comprises positioning a material on one part of the mould or one part of the chip surface, such that the material is clamped between the said parts of chip and mould after the mould has been closed. The method further provides the step of introducing the encapsulant and creating conditions under which the encapsulant at least partially cures in the mould. In an embodiment, the material may be introduced as a pre-produced moulding into a cavity between a top mould part and a bottom mould part, to such an extent that during operation a bottom face of the moulding presses against at least a part of the chip to be encapsulated, so that the desired portion of the surface of the chip remains exposed.

US patent publication US2004/159961 discloses a semiconductor chip positioned on a carrier having a protective covering for the semiconductor chip to be used as a finger print sensor. A top side of the protective covering has a first portion overlying part of the semiconductor chip, carrier and bonding wires. A second portion is intended to remain free of potting/encapsulation compound to allow access to the sensor area. The second portion is delimited by edges, and preferably has a shape allowing easy positioning of a fingertip on the sensitive area of the semiconductor chip.

US patent publication US2009/079091 relates to an integrated circuit packaging system using an interposer array with an access opening wherein symmetrically arranged IC's are fabricated. A base package is singulated from a base package substrate sheet and the interposer array by cutting the access opening through the center.

SUMMARY OF THE INVENTION

The present invention seeks to provide an improved method of manufacturing an integrated circuit (IC) package, such as a Quad Flat No-lead (QFN) circuit package, a Land Grid Array (LGA) integrated circuit package or a Ball Grid Array (BGA) integrated circuit package, allowing for efficient batch wise separation of a plurality of circuit packages in an array arrangement and provide improved exposure and accessibility of package internals of each package.

According to the present invention, a method of the type defined in the preamble is provided comprising the steps of a) providing a plurality of die members connected to respective electrical contact members in a mould and b) providing a mould insert in contact with at least a part of a first upper surface of a first die member. The method then proceeds with the step of c) encasing the plurality of die members and the respective electrical contact members into a package collection body and d) cutting the package collection body into at least two separate integrated circuit packages along a first cutting line extending through the package collection body and separating the plurality of die members, wherein the mould insert as provided in step b) extends or spans across a part of the first cutting line.

According to the present invention, the mould insert as used in the method allows for an opening or recess to be made in the package collection body when encasing the plurality of die members and the respective electrical contact members connected thereto, wherein the opening or recess exposes at least in part the first die member. The process of encasing may be envisaged as an overmolding process wherein the mould insert defines a shape and a position of the recess being moulded into the package collection body. The mould insert may be overlaid or covered by a film for allowing film assisted moulding when required. As the mould insert spans across the first cutting line, cutting the package collection body into at least two separate integrated circuit packages along the first cutting line also cuts or dissects the opening or recess into two separate die openings or recess parts, so that each separated integrated circuit package is provided with such a die opening. Each die opening may be viewed as a cut-out along an edge of the associated integrated package exposing a die member thereof.

More specifically, upon completion of cutting along the first cutting line, each die opening created comprises a side opening along a cutting surface, which becomes a part of a side surface of the respective separated integrated circuit package, such as a QFN, LGA or BGA package. The side opening in a separated integrated circuit body may be seen as a cross section of the opening or recess in the package collection body before cutting along the first cutting line.

In light of the above, the method of the present invention provides an efficient way of manufacturing an integrated circuit package comprising a die opening or edge cut-out comprising at least two openings or surfaces from which the die member is exposed. This provides many advantages such as allowing an integrated circuit package to be provided with sensors and/or actuators to be used and/or deployed from different sides of the integrated circuit package. The method of the present invention may be used for manufacturing QFN, LGA and BGA packages.

SHORT DESCRIPTION OF DRAWINGS

Figure 2:
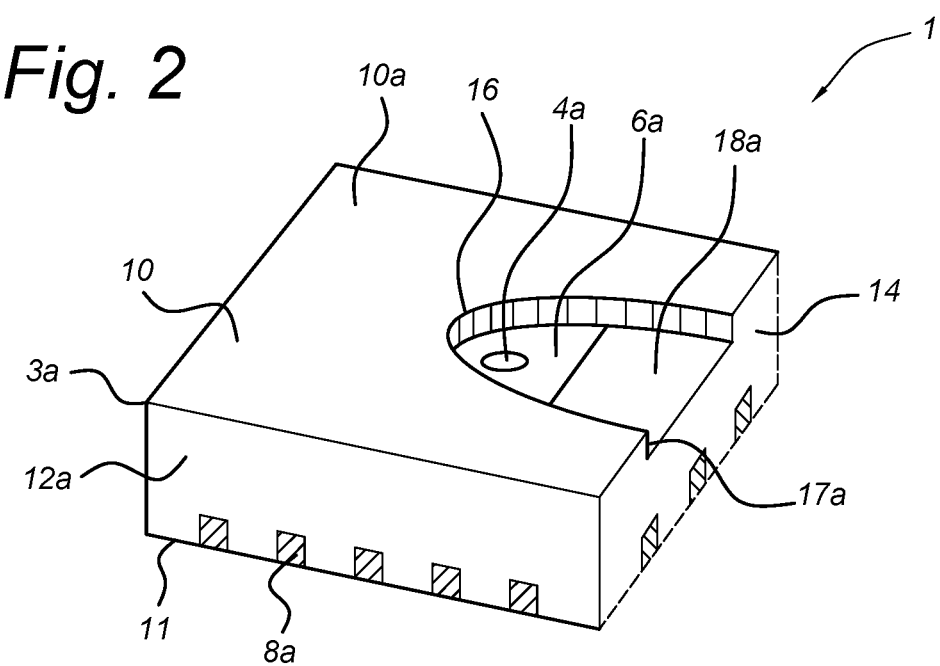

The present invention will be discussed in more detail hereinafter based on a number of exemplary embodiments with reference to the drawings, in which FIG. 1 shows a three dimensional view of an embodiment of an array of integrated circuit packages according to the present invention; and FIG. 2 shows a three dimensional view of an embodiment of a single integrated circuit package according to the present invention.

DETAILED DESCRIPTION OF EXEMPLARY EMBODIMENTS

Integrated circuit packages, or IC packages for short, are being used in an increasing number of applications, wherein an IC package need not only provide common electrical processing circuitry but may even include, for example, one or more sensors for monitoring physical properties such as temperature and/or pressure. In further applications an IC package may even comprise an active element, such as an ignitor or an actuator member.

In light of the increasing number of applications requiring IC packages having sensory or actuation capability, there is a need for an IC package and method for manufacturing such that improved accessibility is provided and exposure of the die member encased in the IC package. In particular, the die member may comprise a sensor and/or actuator wherein the improved accessibility and exposure of the sensor and/or actuator increases the versatility of the IC package.

According to the present invention an integrated circuit package and efficient method for manufacturing are disclosed fulfilling at least in part the above expressed needs.

FIG. 1 shows a three dimensional view of an embodiment of an array of integrated circuit packages according to the present invention, and FIG. 2 shows a three dimensional view of an embodiment of a single, separated IC package according to the present invention.

The method of the present invention of manufacturing an IC package as embodied in FIG. 2, for example, begins with the step of a) providing a plurality of die members 4a, 4b connected to respective electrical contact members 8a, 8b in a mould. In an embodiment, each die member 4a, 4b may be connected to one or more respective electrical contact members 8a, 8b with corresponding bonding wires 7. In another embodiment each die member 4a, 4b may be mounted or connected directly to the one or more respective electrical contact members 8a, 8b. In even further embodiments, each die member 4a, 4b may be connected to one or more respective electrical contact members 8a, 8b through a lead frame and/or interposer as used for e.g. LGA/BGA packages.

To allow a die member 4a, 4b to be at least in part exposed in the final product, i.e. the IC package to be manufactured, the method comprises the step of b) providing a mould insert in contact with at least a part of a first upper surface 6a of a first die member 4a. The mould insert may be overlaid or covered by a film for allowing film assisted moulding when required, so in an embodiment the step of b) may comprise providing a film-covered mould insert in contact with at least a part of a first upper surface 6a of a first die member 4a. The mould insert (not drawn), with or without a film, is arranged to prevent package material from covering at least in part the first upper surface 6a during further manufacturing steps.

Once the plurality of die members 4a, 4b and the respective electrical contact members 8a, 8b are in the mould and the mould insert is provided as outlined above, the method then comprises the step of c) encasing the plurality of die members 4a, 4b and the respective electrical contact members 8a, 8b into a package collection body 3. The package collection body 3 may be construed as an array arrangement or a batch of a plurality IC packages yet to be separated into individual IC packages. During encasement, the mould insert prevents any package material to reach and cover at least in part the first upper surface 6a of the first die member 4a as it should remain exposed in the final product. In an embodiment, the encasement step may be seen as an overmolding process using e.g. a thermoplastic or thermosetting polymer material.

After the encasement step, a solid or solidified package collection body 3 is obtained in which the plurality of die members 4a, 4b and respective electrical contact members 8a, 8b are at least in part embedded and wherein an opening 16, recess 16 or recess like feature 16 is provided in the package collection body 3 by the mould insert. The opening 16 extends from an upper surface 10 of the package collection body 3 to at least a part of the first upper surface 6a of the first die member 4a. It is noted that as shown in FIG. 1, a plurality of openings 16 may be provided using a respective plurality of mould inserts, which may be film-covered mould inserts as explained earlier.

According to the present invention, an IC package provided with improved exposure and accessibility of package internals is then obtained through the method step of d) cutting the package collection body 3 into at least two separate integrated circuit packages 3a, 3b along a first cutting line $S_1$ extending through the package collection body 3 and separating the plurality of die members 4a, 4b, wherein the mould insert as provided in step b) extends or spans across a part of the first cutting line $S_1$, i.e. during encasement of step c).

Through the above cutting step d), exposure of e.g. the first die member 4a is improved because the opening 16 or recess like feature 16 created in the package collection body 3 by the mould insert is subsequently cut or dissected into two die openings 18a, 18b, each of which may be embodied as a cut-out arranged along an edge of a respective separated IC package 3a, 3b.

As shown in FIG. 2, a first die opening 18a is obtained exposing at least in part the first die member 4a once the package collection body 3 is cut and separated into two integrated circuit packages 3a, 3b. In particular, the first die opening 18a comprises a part (e.g. a half) of the opening 16 but also comprises a first side opening 17a that extends from a first side surface 12a (of four side surfaces 12a) of a first integrated circuit package 3a to the first upper surface 6a of the first die member 4a, and wherein the first side opening 17a is arranged along the first cutting line $S_1$. That is, through cutting the package collection body 3 a first cutting surface 14 is created as one of the (four) side surfaces 12a of the package 3a, wherein the first side opening 17a lies within the first cutting surface 14. The first side opening 17a may also be seen as a cross section of the opening or recess 16 as created by the mould insert upon completion of the encasement step.

As shown in the exemplary embodiments of FIG. 1, the opening 16 is delimited by a border wall 19 extending substantially perpendicular to the (major) upper surface 10 of the package collection body 3 (and substantially perpendicular to the upper surface 6a, 6b of the die members 4a, 4b, respectively). In alternative embodiments, the border wall 19 may be a sloping wall, or a curved wall. Similarly, the border wall 19 is also delimiting the first and second die opening 18a, 18b in the respective separated packages 3a, 3b.

Through the above method steps a) to d) an efficient way of manufacturing a first integrated circuit package 3a is provided comprising a first die opening 18a for exposing the first die member 4a, wherein the first die opening 18a is defined by two openings in two outer surfaces or sides of the first integrated surface package 3a. For example, the first integrated circuit package 3a comprises a first upper opening in a first upper surface 10a because the mould projected into the package collection body 3 through the upper surface 10 of the package collection body 3 during encasement, and a first side opening 17a in one of the side surfaces 12a is obtained through cutting along the first cutting line $S_1$.

The first die opening 18a as disclosed above is readily generalised as being a die opening comprising a plurality of openings such as an upper opening and a side opening 17a through which a die member is exposed and can be accessed if needed. The die opening 18a allows sensory or actuation capability from different directions with respect to the IC package in which is it provided, so that the versatility of the IC package is increased. For example, having a side opening 17a in the IC package may allow sideways sensory and actuation capability (e.g. by fluid access to and fluid contact with the exposed die member 4a, 4b) in case there are height limitations to the IC package. In case there is a width limitation to the IC package then the upper opening allows for sensory and actuation capability of the same IC package.

With the above method it is now possible to efficiently manufacture a plurality of integrated circuit packages 3a, 3b, wherein each IC package 3a, 3b provides improved accessibility and exposure of die members 4a, 4b encased therein.

In an embodiment the method step of a) for providing a plurality of die members 4a, 4b connected to respective electrical contact members 8a, 8b may further comprise providing a second die member 4b mirrored with respect to the first die member 4a along the first cutting line $S_1$. Through this embodiment two separate IC packages 3a, 3b are obtained, wherein the first and the second die member 4a, 4b are being separated when cutting through the package collection body 3 along the first cutting line $S_1$. The obtained two IC packages 3a, 3b both comprise a die opening as outlined above, i.e. a first die opening 18a and a second die opening 18b, respectively.

Cutting along the first cutting line $S_1$ as performed in step d) may further comprise cutting through the respective electrical contact members 8a, 8b. Doing so provides respective electrical contact members 8a, 8b that are flush with the first side surfaces 12a and second side surfaces 12b of the first and second IC packages 3a, 3b respectively. For example, in FIG. 1 further electrical contact members 9 are depicted spanning across a second cutting line $S_3$. Upon completion of the cutting step along the second cutting line $S_3$, the further electrical contact members 9 will be flush with one of the four second side surfaces 12b of the separated second IC package 3b following in part the second cutting line $S_3$.

The mould insert as provided in step b) extends or spans across a part of the first cutting line $S_1$, wherein the at least two separated IC packages 3a, 3b can both benefit from improved exposure and accessibility through respective first and second die openings 18a, 18b, each of which die opening 18a, 18b comprises a part of the opening or recess 16 as well as a first side opening 17a and second side opening (not shown) created by cutting through the package collection body 3 and the opening or recess 16 during the cutting step.

In an advantageous embodiment, the method may further comprise arranging the mould insert symmetrically over the first cutting line $S_1$. That is, after encasement of the plurality of die members 4a, 4b and the respective electrical contact members 8a, 8b, the opening 16 spans across the first cutting line $S_1$ symmetrically, wherein each separated IC package 3a, 3b comprises a respective first and second die opening 18a, 18b of the same shape and size. As to the shape of the mould insert, the method may further comprise selecting a circular, elliptical, square, rectangular or polygonal shape for the mould insert. The shape of the mould insert can be selected on an application basis and may depend on what size and shape of exposure and accessibility to a die member is required.

To provide sufficient freedom in choosing a particular encasement layout of the respective electrical contact members 8a, 8b, an embodiment is provided wherein the respective electrical contact members 8a, 8b are mirrored with respect to the first cutting line $S_1$. With this embodiment the mould insert can be utilized to obtain the opening or recess 16 extending from an upper surface 10 of the package collection body 3 to at least a part of the first upper surface 6a of the first die member 4a, and to at least a part of a second upper surface 6b of the second die member 4b. The two separated IC packages 3a, 3b then have a mirrored layout of the respective electrical contact members 8a, 8b with respect to each other, yet each IC package 3a, 3b comprises a respective die opening 18a, 18b each of which is provided with an upper opening and side opening improving the exposure of the die.

In an alternative embodiment, the respective electrical contact members 8a, 8b are not mirrored with respect to the first cutting line $S_1$. In this embodiment the mould insert and placement thereof is the same as the above described embodiment, but placement and layout of respective electrical contact members 8a, 8b need not be mirrored or aligned with respect to the first cutting line $S_1$, allowing the first and second IC packages 3a, 3b not being mirrored versions of each other, thus providing further flexibility to the electrical contact member layout of the first and second IC packages 3a, 3b.

So in light of the above, the method of the present invention allows for a plurality of circuit packages (e.g. QFN, LGA, BGA packages) to be manufactured having different electrical contact member layouts to meet specifications yet enable the use of a single mould insert for providing an opening or recess 16 in the package collection body 3 exposing at least in part two or more die members 4a, 4b.

Further alternative layout and placement of electrical contact members 8a, 8b is conceivable. For example, in a further embodiment the at least two separate integrated circuit packages 3a, 3b are Quad Flat No-Lead (QFN) packages. This embodiment is efficiently obtained by the cutting step d), which may further comprise cutting through the respective electrical contact members 8a, 8b so that said members 8a, 8b become flush with side surfaces of separated IC packages 3a, 3b. In this embodiment the respective electrical contact members 8a, 8b may then be seen as respective lead frame members 8a, 8b. In even further embodiments the at least two separate integrated circuit packages 3a, 3b are Land Grid Array (LGA) packages or Ball Grid Array (BGA) packages.

Referring to FIG. 1, in an embodiment the method step further comprises arranging the plurality of die members 4a, 4b and respective electrical contact members 8a, 8b in an array, i.e. allowing a row and column based arrangement of the plurality of die members 4a, 4b and respective electrical contact members 8a, 8b in the package collection body 3. The row and column based array arrangement allows the first cutting line $S_1$ to be straight, thereby simplifying cutting through the package collection body 3. In a further embodiment one or more mould inserts, optionally covered by a film may be placed in an array arrangement to obtain an array arrangement of a plurality of openings or recesses 16 after encasement of the plurality of die members 4a, 4b and respective electrical contact members 8a, 8b. In an embodiment the plurality of mould inserts 16 span symmetrically across the first cutting line $S_1$. For example, FIG. 1 depicts an advantageous embodiment wherein a plurality of openings 16 are arranged in a column wise fashion so that cutting along the first cutting line $S_1$ dissects each opening or recess 16 into two parts, each part being a die opening 18, 18b exposing at least in part a respective die member 4a, 4b.

In light of the above mentioned array arrangement as depicted in FIG. 1, one or more further cutting lines $S_2$, $S_4$ may be defined perpendicular the first cutting line $S_1$ for further separating the at least two IC packages 3a, 3b within the package collection body 3. In particular, the method step of d) cutting the package collection body 3 may further comprise cutting the package collection body 3 along one or more further cutting lines $S_2$, $S_4$ extending through the package collection body 3 perpendicular to the first cutting line $S_1$. Through this embodiment, for example, the at least two IC packages 3a, 3b are then separated further from the package collection body 3. In a further embodiment cutting along the one or more further cutting lines $S_2$, $S_4$ may comprise cutting through electrical contact members 8a, 8b as well, which is advantageous for obtaining QFN circuit packages.

According to the present invention, the method allows for improved sensory and/or actuation capability to be provided in an IC package. For example, in an embodiment the first die member 4a may comprise a pressure and/or a temperature sensor, so that sensory capability is provided to the integrated circuit package. In a further embodiment, actuation capability can also be provided as the first die member 4a may comprise an active element, such as a combustion starting element or a sensor element. The combustion starting element may be configured for providing heat (e.g. a hot spot). To that end an embodiment may be provided wherein the combustion starting element is e.g. a glow wire. In an exemplary embodiment such a combustion starting element may facilitate ignition of a combustion material provided in the space provided by opening 16, wherein the first die member 4a comprises e.g. a glow wire and the like as the combustion starting element. Proper firing of the combustion starting element may be enhanced by a proper shape of the opening 16.

Based on the above mentioned IC packages obtainable from the method of the present invention, in a further aspect the present invention relates to an integrated circuit package 1 depicted in exemplary fashion in FIG. 2. The integrated circuit package 1 comprises a die member 4a connected to one or more electrical contact members 8a at least partially encased in a package 3a. The one or more electrical contact members 8a may be exposed at (one or more) side surfaces 12a of the package 3a. In an embodiment the one or more electrical contact members 8a may be flush with the side surface(s) 12a, such as one or more electrical contact members of the type used for QFN packages. In a further embodiment the one or more electrical contact members 8a may be embodied as flat or pad-like contact members of the type used for LGA packages. In an even further embodiment the one or more electrical contact members 8a may be embodied as ball-like contact members of the type used for BGA packages.

According to the present invention a die opening 18a is provided in the IC package 1 exposing at least a part of the die member 4a, wherein one side surface 12a of the package 3a is a first cutting surface 14. The die opening 18a comprises an upper opening 16 extending from an upper (major) surface 10a of the package 3a to an upper surface 6a of the die member 4a, and a side opening 17a extending from the first cutting surface 14 to the upper surface 6a of the die member 4a.

In a further embodiment, the upper opening 16 has a border wall 19 extending from the upper (major) surface 10a to the upper surface 6a of the die member 4a, as shown in the exemplary views of FIG. 1 and FIG. 2, as a result of the formation of the upper opening 16 in the package collection body 3 as described above.

The integrated circuit package 1 of the present invention thus comprises a die opening 18a exposing at least in part the die member 4a from a plurality of sides or surfaces, i.e. from the upper opening 16 and a side opening 17a of the package 3a. For further clarity, the die opening 18a may be viewed as a cut-out arranged along an edge of the package 3a whereby the IC package 1 allows for exposure and accessibility to the die member 4a for sensory and/or actuation capability from different directions with respect to the package 3a. For example, in case there is a height limitation when using the IC package 1 for a particular application, then sensory and/or actuation capability can be utilized through the side opening 17a. Should there be a width limitation when using the IC package 1 then sensory and/or actuation capability can be utilized from the upper opening 16 of the package 3a.

In an advantageous embodiment, the die member 4a comprises a combustion starting element, so that compact and versatile deployment of the integrated circuit package 1 in combustion engine applications is possible. In an exemplary embodiment the combustion starting element is a heating element, such as a glow wire, wherein the heating element may assist combustion ignition. These embodiments clearly show that the IC package 1 of the present invention can be used in a greater variety of applications.

The present invention has been described above with reference to a number of exemplary embodiments as shown in and described with reference to the drawings. Modifications and alternative implementations of some parts or elements are possible, and are included in the scope of protection as defined in the appended claims.

The invention claimed is:

1. A method of making an integrated circuit package, comprising the steps of
   a) providing a plurality of die members connected to respective electrical contact members in a mould;
   b) providing a mould insert in contact with at least a part of a first upper surface of a first die member;
   c) encasing the plurality of die members and the respective electrical contact members into a package collection body; and
   d) cutting the package collection body into at least two separate integrated circuit packages along a first cutting line extending through the package collection body and separating the plurality of die members, wherein the mould insert as provided in step b) extends across a part of the first cutting line, thereby forming a side opening in a side surface of each of the at lease two separate integrated circuit packages.

2. The method according to claim 1, further comprising providing a second die member mirrored with respect to the first die member along the first cutting line.

3. The method according to claim 1, wherein the at least two separate integrated circuit packages Quad Flat No-Lead (QFN) packages, Land Grid Array (LGA) or Ball Grid Array (BGA) packages.

4. The method according to claim 1, further comprising arranging the plurality of die members and respective electrical contact members in an array.

5. The method according to claim 1, wherein the first die member comprises an active element, such as a combustion starting element or a sensor element.

6. The method according to claim 1, wherein the respective electrical contact members are not mirrored with respect to the first cutting line.

7. The method according to claim 1, wherein the respective electrical contact members are mirrored with respect to the first cutting line.

8. The method according to claim 1, further comprising arranging the mould insert symmetrically over the first cutting line.

9. The method according to claim 1, further comprising selecting a circular, elliptical, square, rectangular or polygonal shape for the mould insert.

10. An integrated circuit package, comprising a die member connected to one or more electrical contact members encased in a package, and wherein a die opening is provided exposing at least a part of the die member, wherein one side surface of the package is a straight surface,
wherein the die opening comprises an upper opening extending from an upper surface of the package to an upper surface of the die member, and a side opening within the straight surface and extending from the straight surface to the upper surface of the die member wherein the side opening is formed as a cross section of the upper opening.

11. The integrated circuit package according to claim 10, wherein the upper opening has a border wall extending from the upper major surface to the upper surface of the die member.

12. The integrated circuit package according to claim 10, wherein the die member comprises a combustion starting element.

* * * * *